United States Patent

Kamata et al.

[11] Patent Number: 6,060,329
[45] Date of Patent: May 9, 2000

[54] METHOD FOR PLASMA TREATMENT AND APPARATUS FOR PLASMA TREATMENT

[75] Inventors: Takeshi Kamata; Hiroshi Arimoto, both of Kanagawa, Japan

[73] Assignee: Fujitsu Limited, Kawasaki, Japan

[21] Appl. No.: 09/049,097

[22] Filed: Mar. 27, 1998

[30] Foreign Application Priority Data

Mar. 27, 1997 [JP] Japan .................................. 9-075087

[51] Int. Cl.[7] .................................................. H01L 21/00
[52] U.S. Cl. .................................. 438/9; 438/14; 438/712; 438/726; 156/345
[58] Field of Search .................................. 216/59, 61, 79; 438/9, 14, 17, 712, 726, 727; 156/345 MT, 345 P

[56] References Cited

U.S. PATENT DOCUMENTS

| | | | |
|---|---|---|---|
| 4,668,366 | 5/1987 | Zarowin | 156/345 MT |
| 5,173,146 | 12/1992 | Ito et al. | 156/345 MT |
| 5,415,718 | 5/1995 | Ohmi et al. | 216/61 X |

FOREIGN PATENT DOCUMENTS

| | | |
|---|---|---|
| 1-225149 | 9/1989 | Japan . |
| 3-226579 | 10/1991 | Japan . |
| 6-123693 | 5/1994 | Japan . |
| 6-124902 | 5/1994 | Japan . |
| 7-142410 | 6/1995 | Japan . |

OTHER PUBLICATIONS

A correlation between particle growth and spatiotemporal RF plasma structure, Plasma Sources Sci. Technol.3, p. 310–313.

In situ polarization–sensitive laser–light–scattering method for simultaneous measurements of two–dimensional spatial size and density distributions of particles in plasmas, J. Vac. Sci. Technol.A 14(2), p. 603–605.

On the Effect of Sheath Capacitance in the Measurements by Insulated Pulse Probe Method, Proceeding of the 3rd International Conference on Reacitve Plasmas and 14th Symposium on Plasma Processing.

A New Technology using TiN–CVD Electrode and Non Etch Back SOG Interlayer for CROWN Shaped $Ta_2O_5$ Capacitor, VMIC Conference 197 ISMIC, p. 571–593.

*Primary Examiner*—William Powell
*Attorney, Agent, or Firm*—Armstrong, Westerman, Hattori, McLeland & Naughton

[57] ABSTRACT

A method for plasma treatment is disclosed which effects detection of the amount of particles in an plasma generation area measuring the electron density in the particles based on the numerical value of the electric density in the plasma generation area.

17 Claims, 16 Drawing Sheets

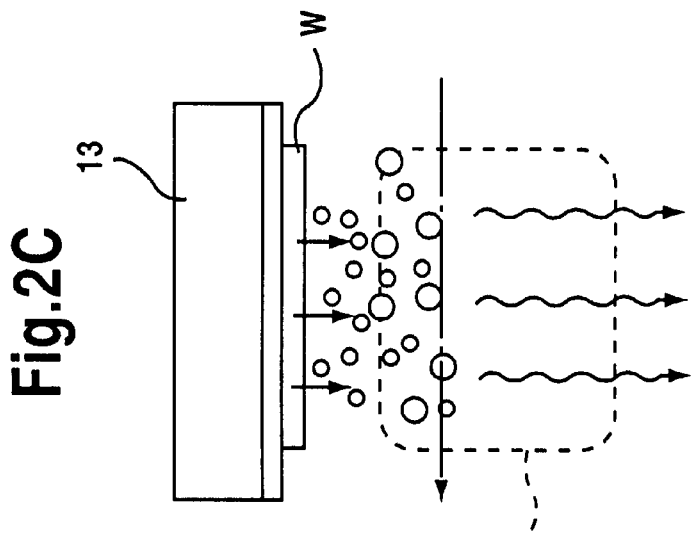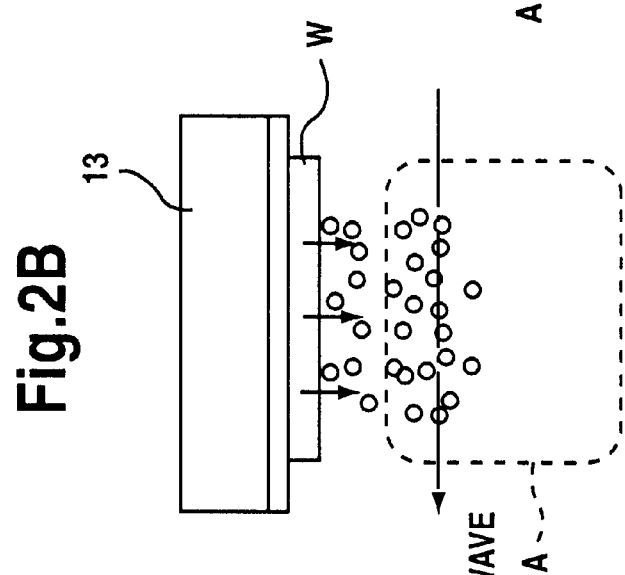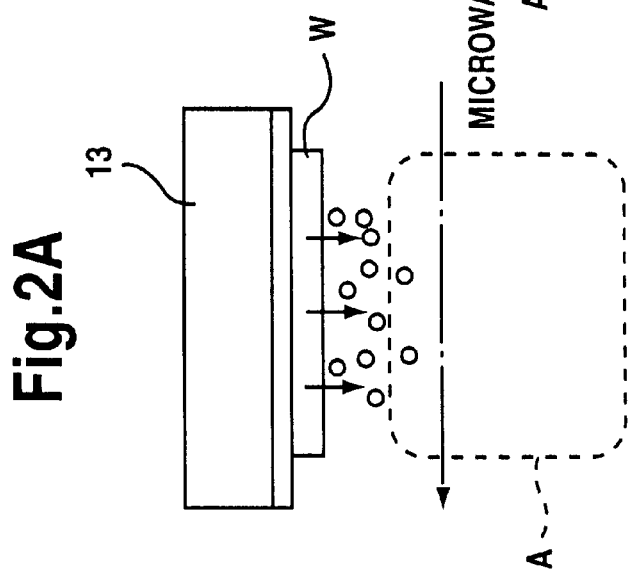

METHOD FOR PLASMA TREATMENT AND APPARATUS FOR PLASMA TREATMENT

BACKGROUND OF THE INVENTION

1. Field of the Invention

This invention relates to a method for plasma treatment and an apparatus for plasma treatment, and more particularly to a method for plasma treatment including an operation of detecting particles contained in the plasma used for growing or etching a membrane and an apparatus for plasma treatment possessed of a mechanism for the detection of such particles.

2. Description of the Prior Art

The process for producing a semiconductor device, for example, includes a step for forming a membrane, for example film, such as is used for a semiconductor, insulator, or conductor by the method of plasma vapor phase deposition or etching such membrane by the reactive ion etching method, plasma etching method, etc. The construction for generating plasma in this process is known in various types, i.e. a construction adapted to apply radio frequency power to a pair of electrodes installed in a reduced-pressure atmosphere, a structure adapted to apply high-frequency power to a conductive coil disposed around a plasma generating zone, and a construction adapted to introduce a microwave into a plasma generating zone from an external source.

The problem which is raised during the generation of such plasma resides in the fact that the particles (suspended fine particles) which are present in the plasma mingle into a membrane in the process of deposition or adhere to a membrane in the process of patterning and impair the pattern conferred on the finished membrane.

These particles are mainly produced by the emission from a sputtered membrane or by the accidental bombardment of the plasma by the clusters shed from the inner wall of the chamber.

The clusters scattered from the inner wall of the chamber roughly measure some tens of nm across. In the plasma, they either agglomerate electrostatically or constitute themselves the seeds for growth of a reactive radical element, with the result that they will eventually form particles and settle down.

Various methods, therefore, have been employed in an effort to determine the condition of occurrence of such particles in the plasma. The surveillance of particles by means of a CCD camera is disclosed in JP-A-06-124,902 and JP-A-07-142,410, the method resorting to the practice of taking count of particles passing through an exhaust line is disclosed in JP-A-03-226,579, and the procedure comprising the steps of collecting particles and taking count of them by means of a detector is disclosed in JP-A06-123,693, for example.

For the observation of particles by the CCD camera, the existing level of CCD resolution does not allow fully accurate determination. The method of taking count of particles passing through the exhaust line or the method of collecting and taking count of particles encounters difficulty in acquiring real-time determination of the occurrence of particles with high accuracy.

As a means of effecting field observation of the number of particles, an optical method resorting to the laser scattering process is disclosed, for example, in T. Kamata et al., Plasma Sources Sci. Technol. 3, 1994, pp. 310–313. This method consists in detecting the Mie scattering light generated by particles with the aid of an optical detector.

The apparatus used for this detection of particles is constructed as illustrated in FIGS. 19A and 3, for example. Specifically, it has a Argon Ion laser 1 for injecting a laser beam in a plasma zone A, an optical detector 2 for admitting the Mie scattering light caused by particles, a rotary polarizer 3, and a lens 4 arranged accordingly.

When the laser beam is incident on the particles in the plasma zone A causes the Mie scattering light, the light passes through the rotary polarizer 3, and is collimated into the optical detector 2 by the lens 4.

The rotary polarizer 3 converts the incident light to the linear polarization light and injects the linear polarized light into the optical detector 2. Let the plane including both laser beam and direction of scattered light of the linear polarized light serve as a plane of observation, and the beam of light parallel to the plane of observation will form a P polarized light component and the beam of light perpendicular to the plane of observation will form an S polarized light component. Then, the size of particles of interest is rated by the magnitude of the division S/P.

With reference to FIG. 19A, reference numeral 10 denotes an apparatus for plasma treatment, 11 a chamber, 13, a first electrode, 14 a second electrode, 17 a capacitor, 18 a high-frequency power source, 20 a window pervious to light, and 22 an air vent.

With the mechanism for detecting such particles by the use of the laser scattering method described above, it is difficult to attain additional installation of an optical detector and a light source within the existing chamber which is possessed of a plasma zone.

Moreover, since the Mie scattering light is unusually feeble and rich in optical noise, any apparatus which is capable of accurately detecting this light is complicated in mechanism and expensive as well.

SUMMARY OF THE INVENTION

It is an object of this invention to provide a method for performing a plasma treatment which is simple in principle and capable of effecting real-time monitor or insitu monitor of the number of particles with high accuracy and an apparatus for the plasma treatment which operates by such a simple principle as mentioned above.

This invention contemplates attaining real-time detection of the presence or absence of particles and the amount of particles in the plasma zone during the generation of plasma by detecting the magnitude of electron density or the change in the amount of electron density in the plasma zone.

The change in the density of electrons in the plasma zone can be easily detected by some means such as the irradiation of a microwave to the plasma zone from a source installed outside the chamber for plasma treatment. The mechanism used for the detection of the electron density in this case can be wholly coped with electrically except for the transfer of the microwave and, therefore, calls for no addition to size. Thus, it can be easily fitted to the existing equipment.

The magnitude of electron density to be determined by the irradiation of a microwave is found by measuring a deflection of the phase of the microwave in the plasma zone and computing a prescribed formula incorporating the result of the measurement therein.

It is to be concluded that the amount of particles increases in accordance as the magnitude of electron density decreases and that the amount of particles conversely decreases in accordance as the magnitude of electron density increases. This rule is based on the fact that the electron density in the plasma zone decreases as the electrons are catched by the particles.

In the apparatus for plasma generation with high-frequency (radio-frequency) power source, when the magnitude of the high-frequency power applied to a pair of electrodes for the generation of plasma is varied, the magnitude of electron density is varied as well. It is owing to the change with time in the electron density that the presence or absence of the occurrence of particles and the amount of particles are detected.

When the particles are present where the ability to generate plasma is to be decreased by lowering the high-frequency power, the decay rate of the electron density in the zone of plasma generation is suppressed because the loss of electrons by the ambipolar diffusion is suppressed. The amount of particles, therefore, can be easily judged by the decay rate of the electron density. When the particles are present where the ability to generate plasma is to be increased by augmenting the high-frequency power, the growth rate of the electron density in the zone of plasma generation is enhanced because the loss of electrons by the ambipolar diffusion is suppressed. The amount of particles, therefore, can be easily judged by the extent of the ratio of this increase.

Thus, the presence or absence of particles, the size of particles, etc. can be judged by examining the rise time or the fall time of the electron density while the magnitude of the high-frequency power is varied as described above.

When the numbers of particles are over the fixed value in the chamber, the chamber is to be cleaned.

BRIEF DESCRIPTION OF THE DRAWING

FIGS. 2A–C are diagrams illustrating the condition of generation of the particles used in an experiment intended to describe one embodiment of this invention;

DESCRIPTION OF THE PREFERRED EMBODIMENTS

Now, the mode of embodying the present invention will be described below with reference to the drawings annexed hereto.

Figure 1:
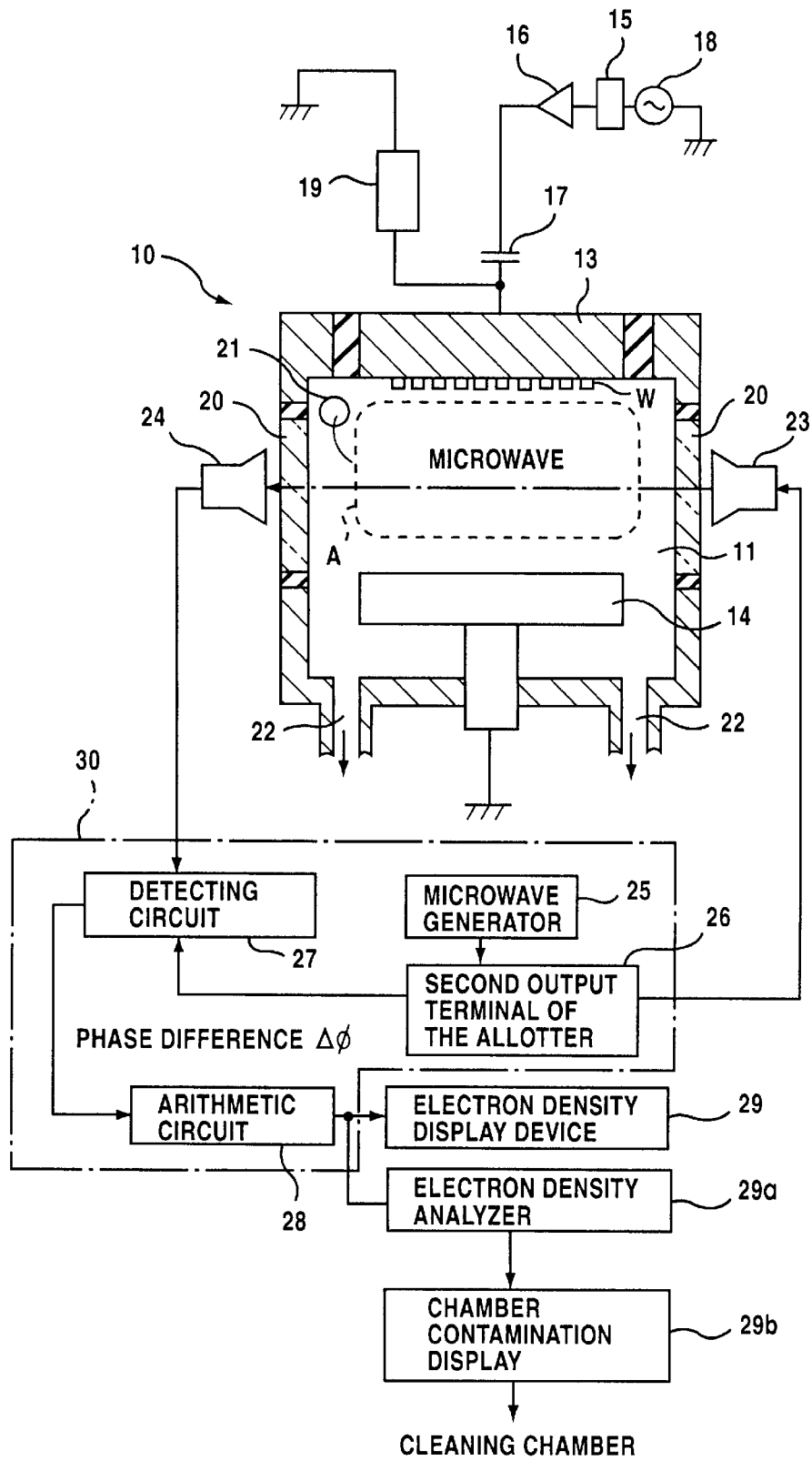
FIG. 1 is a structural diagram of an apparatus for the detection of particles, illustrating one embodiment of this invention.

FIG. 1 is a structural diagram of an apparatus for plasma treatment which is provided with the mechanism for detection of particles representing the first embodiment of this invention.

First, a capacitive coupling type apparatus 10 for the RF plasma treatment shown in FIG. 1 will tie described.

In the apparatus 10 for plasma treatment, a first electrode 13 is disposed on the ceiling part of the interior of a chamber 11, a second electrode 14 is disposed on the bottom part of the chamber 11, and the empty space intervening between the first and second electrode 13 and 14 is intended as an plasma generating area A. To the first electrode 13, a high-frequency (radio-frequency) generator (oscillator) 18 is connected via an AM modulator 15, an amplifier 16, and a capacitor 17 and a voltage probe 19 for the measurement of the amplitude of voltage is also connected. The second electrode 14 is either grounded or connected to a constant voltage generator.

A pair of windows 20 made of silica are fitted in an opposed state to the lateral wall of the chamber 11. The chamber 11 is further provided therein with a gas inlet 21 for introducing a gas and an air vent 22 for releasing the gas to the exterior.

The chamber 11 of the apparatus 10 for plasma treatment which is used in the present experiment has a cylindrical shaped and measures 30 cm in inside diameter of the inner wall and 20 cm in height. The diameter of the electrodes is 10 cm. The frequency generated by the high-frequency generator 18 is set at 13.56 MHz and the duty ratio of the AM modulation is set at 50.

Next, a apparatus for measuring particles in the plasma generating area A will be described.

A first antenna 23 and a second antenna 24 are fitted to the outer sides of the two windows disposed inside the chamber 11. These two antennas 23 and 24 have the shape of a horn and are so disposed as to be opposed to each other via the two windows 20.

The terminal of the first antenna 23 is connected to the first output terminal of an allotter 26 adapted to halve the output signal of a microwave generator 25. The second output terminal of the allotter 26 is connected to the first input terminal of a phase detecting circuit 27 and the terminal of the second antenna 24 is connected to the second input terminal of the phase detecting circuit 27. The phase detecting circuit 27 is so constructed as to detect a phase difference $\Delta\phi$ between the output signal of the second antenna 24 and the transmitting signal of the generator 25 and transmit it to an arithmetic circuit 28.

The arithmetic circuit 28 is so constructed as to find a plasma electron density Ne in the plasma generating area A by substituting the data of the phase difference $\Delta\phi$ for the relevant variable in the following formula (1) and emit the time change of this density to an electron density display device 29 and an electron density analyzer 29a.

$$Ne = f\Delta\phi/0.842D \qquad (1)$$

In the formula (1), f denotes the microwave frequency (Hz) and D the plasma width (m). The plasma width means the length of the transmission of the microwave in the plasma generating area A.

In the phase detecting circuit 27, the interference between the microwave signal from the input side generator 25 and the microwave from the antenna 24 is varied as the number of electrons in the plasma generating area A is increased. The phase detecting circuit 27 detects a deviation, if any, of phase between the microwaves caused by this interference and judges the size or number of the particles. The electron density analyzer 29a is intended to find changes of electron density such as, for example, rise time, fall time, ratio of increase, and ratio of attenuation.

Next, this invention has studied the nature of relation between the result of the measurement of the number of particles in the plasma generating area A conducted by the device for detection of particles according to this invention and the result of the measurement of the number of particles conducted in accordance with the conventional Mie scattering.

In the relevant experiment, the detection of particles was conducted by an apparatus constructed as illustrated in FIG. 1 and the conventional method of Mie scattering illustrated in FIGS. 14A and B as well. The laser beam emitted from the semiconductor 1 used in the performance of the method of Mie scattering was projected parallelly to the electrodes 13 and 14, with the wavelength of the beam from the semiconductor 1 set at 488 nm and the output thereof at 1 W. The position of incidence of the laser beam was in the proximity of the electrode 13 which was liable to gather particles, typically at a distance of 2 mm from the electrode 13. This position of incidence ought to be in the neighborhood of the sheath-bulk boundary which is liable to gather particles.

First, the generation of particles in the chamber 11 and the condition thereof will be described below.

To the lower face of the first electrode 13, Teflon (tetrafluoroethylene resin) plates W as the source for generation of particles were set.

Then, argon (Ar) gas was introduced via the gas inlet 21 into the chamber 11 and meanwhile the inner pressure of the charter 11 was set at 200 mTorrs. The power, 13.56 MHz in frequency, from the high-frequency generator 18 was given a pulse modulation to 800 Hz by the AM modulator 15 and a voltage amplification to 120 V by the amplifier. The resultant modulated and amplified alternating voltage was applied to the first electrode 13. The amplitude of this voltage was measured by the voltage probe 19.

First, the microwave was propagated from the first antenna 23 via the plasma generating area A toward the second antenna 24. Then, the high-frequency power which resulted from the AM modulation at a frequency of 800 Hz and a duty ratio of 50 was applied between the first and the second electrode 13 and 14 to induce generation of argon plasma gas within the plasma generating area A. In the state immediately after the generation of plasma, the Teflon plates W generated virtually no particle as illustrated in FIG. 2A. The frequency of the generator 25 was adjusted in advance such that the output of the phase detecting circuit 27 would be zero. This adjustment was effected by a phaser (not shown in the diagram).

After the elapse of 100 seconds following the start of the plasma generation, the clusters of particles expelled from the Teflon plates W electrostatically agglomerate and form particles measuring on the order of submicrons in the plasma generating area A as illustrated in FIG. 2B and these particles settle down under their weight as illustrated in FIG. 2C. Continuation of the generation of particles, therefore, causes the Teflon plates W to grow thin and eventually vanish. The generation of particles is consequently terminated.

The condition of the electron density Ne before the start of the generation of plasma and that during the generation of particles were studied.

Figure 3:
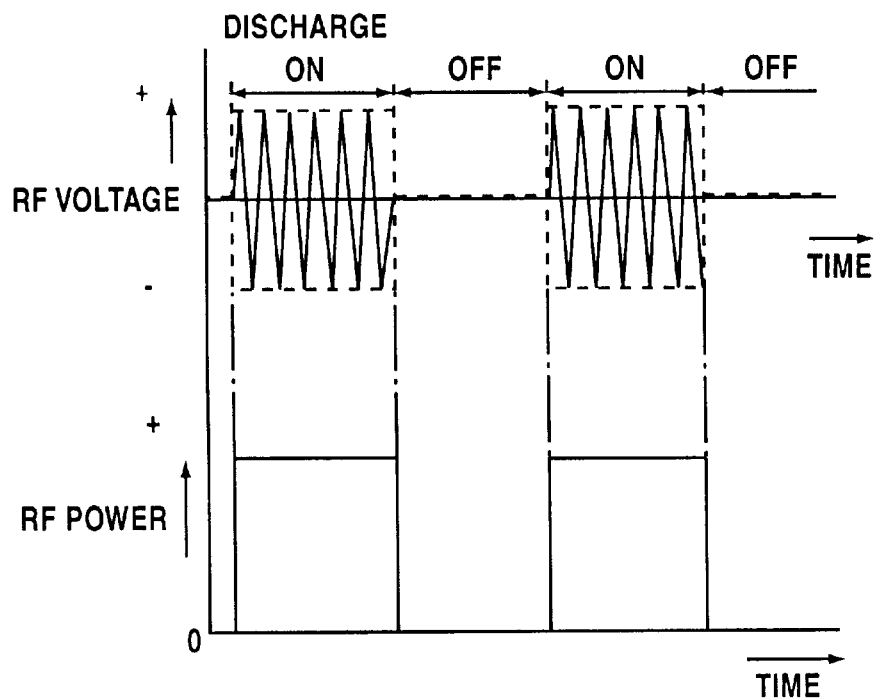
FIG. 3 is a waveform diagram depicting one example of the AM modulation of high-frequency power in one embodiment of this invention.

This study was made by investigating the change of the electron density Ne which was brought about by varying the high-frequency power applied between the first and second electrode 13 and 14 through AM modulation from a high level to a low level as illustrated in FIG. 3. The low level of the power in this case was set at 0 watts.

Figure 4:
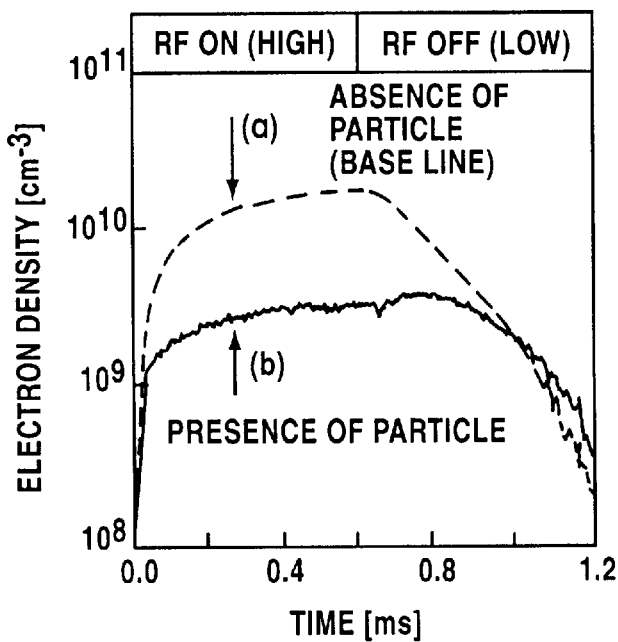
FIG. 4 is a waveform diagram depicting by one ON-OFF cycle of high-frequency power the time variation of electron density due to the presence and absence of particles in one embodiment of this invention.

The results such as are shown in FIG. 4 were obtained by computing the change of electron density Ne due to the change of high-frequency power by means of the arithmetic circuit 28 via the phase detecting circuit 27 and observing this change on the electron density display device 29, i.e. an oscilloscope. In FIG. 4, the vertical axis is the logarithmic scale of the found values of electron density.

As indicated by a broken line in FIG. 4, the electron density rapidly varied between the range of high level and that of low level of electric power when the particles were absent from the plasma generating area A and the electron density exponentially decreased in the range of low level of electric power when the supply of the electric power was stopped.

In contrast, when the particles were present in the plasma generating area A, the change of the electron density was gradual when the electric power was shifted from the range of high level to that of low level and the ratio of attenuation of the electron density decreased in the range of low level as indicated by a solid line in FIG. 4.

The reason for the presence of this correlation between the number of particles and the electron density is that the amount of charge on the particles increases as the size of the particles and the number of particles increases. Incidentally, the presence or absence of the particles is judged by using as the base line the broken line of FIG. 4 which indicates the absence of particles.

Figure 19A:
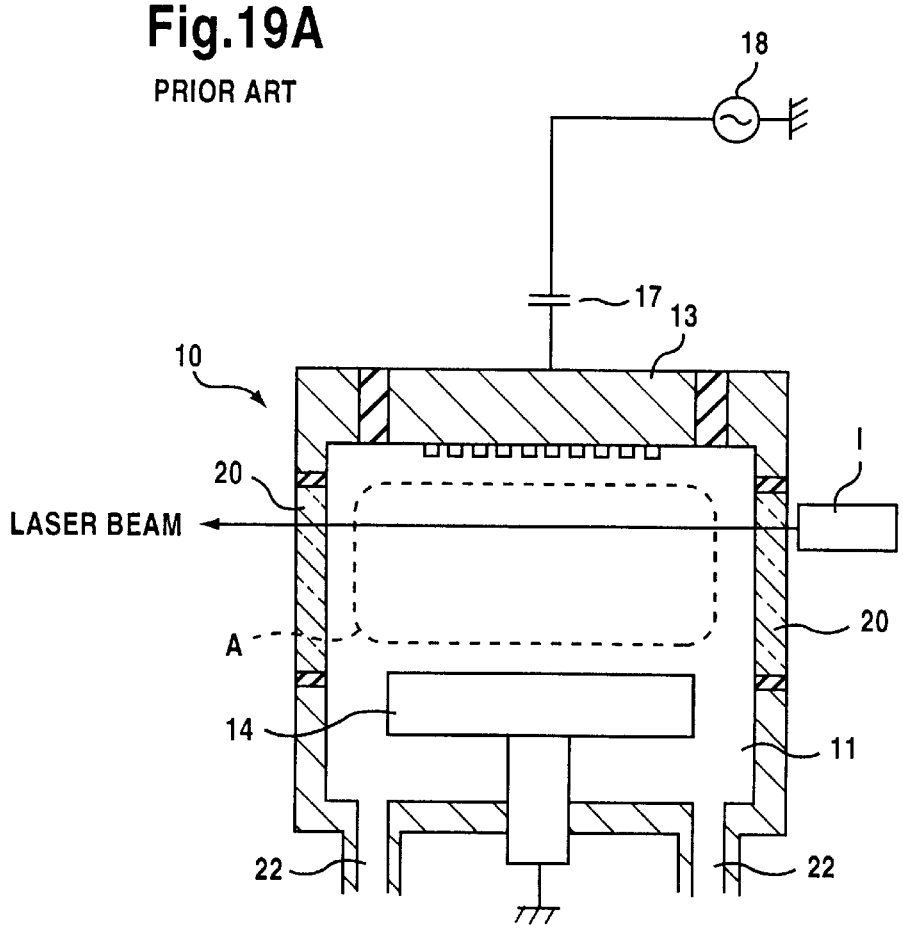
FIGS. 19A and B are structural diagrams depicting the conventional method for the detection of particles by the Mie scattering.

Then, the results of the measurement of particles by the method of Mie scattering illustrated in FIGS. 19A and 19B and the results of an experiment of FIG. 4 will be explained below by giving them a comparative study.

Figure 19B:
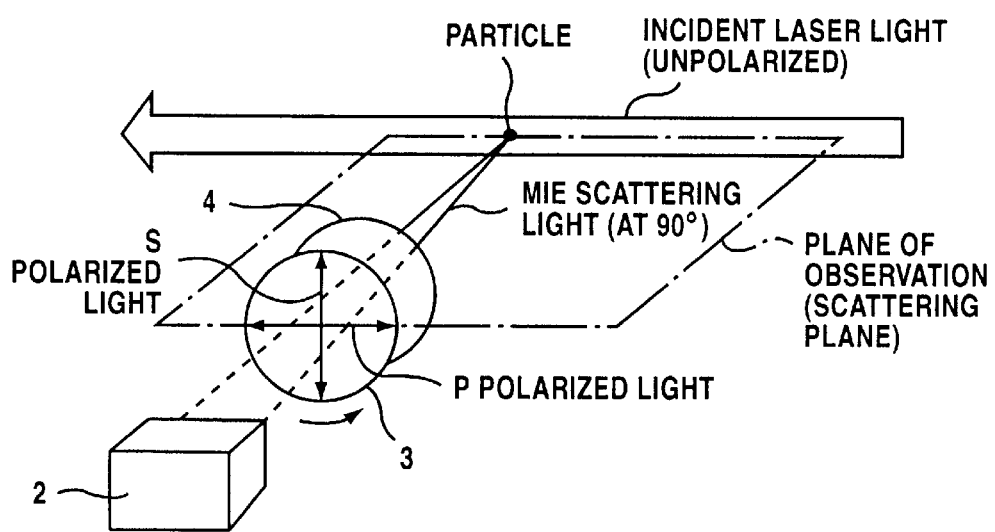

The wavelength of the Argon Ion laser 1 used for the detection of particles by the method of Mie scattering was set at 488 nm and the light scattered by the particles, which is in a direction of 90 degrees relative to the direction of advance of the laser beam, was detected by a light detecting device 2 illustrated in FIG. 19B.

Figure 5:
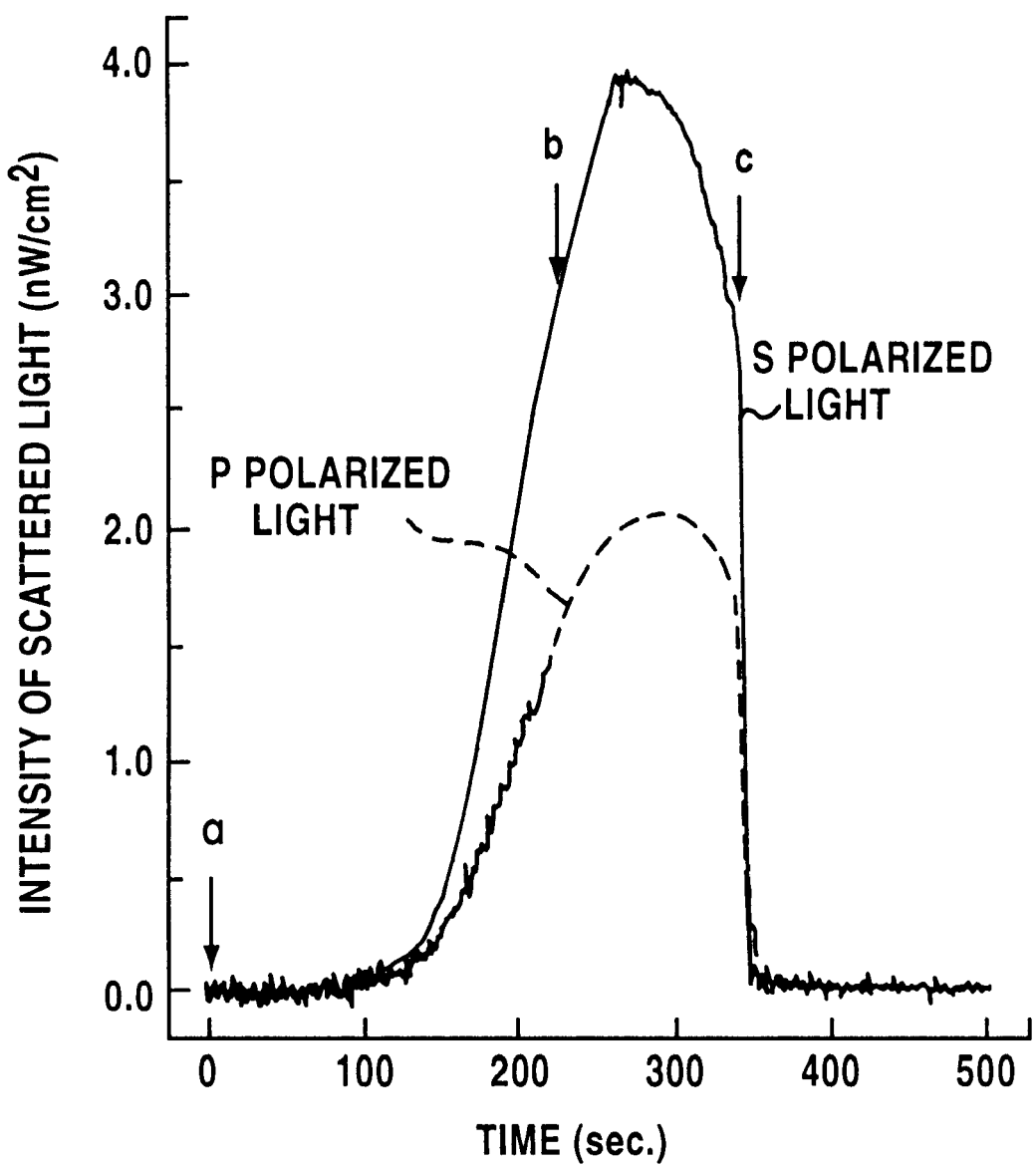
FIG. 5 is a diagram depicting the time variation change of the intensity of scattered light in an experiment using the method of detection of particles by the conventional Mie scattering.

The time variation with the P polarized light intensity and the S polarized light intensity by Mie scattering were as shown in FIG. 5. In FIG. 5, the point a represents the condition of FIG. 2A, the point b that of FIG. 2B, and the point c that of FIG. 2C. According to the data of FIG. 5, the intensity of the light scattered by the particles originating from the Teflon plates W increased gradually to a certain extent and suddenly attenuated after reaching a peak.

The electron density indicated in FIG. 4 as avoiding generation of particles corresponds to the point a in FIG. 5 representing the results of the measurement of particles by the method of Mie scattering. The electron density indicated in FIG. 4 as allowing the presence of particles corresponds to the point b in FIG. 5 representing the results of the measurement of particles by the method of Mie scattering. From these results it is noted that the electron density decreases in the presence of particles.

Figure 6:
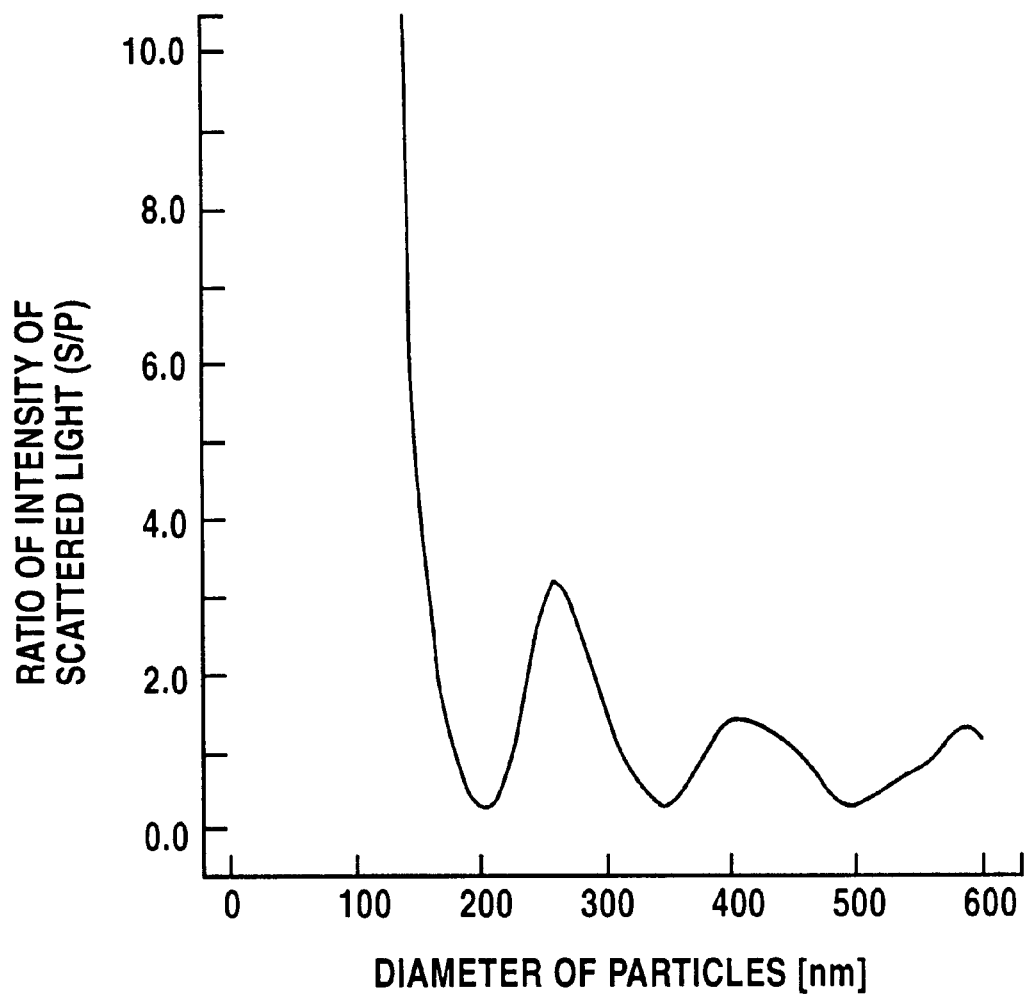
FIG. 6 is a diagram showing the relation between the diameter of particles and the ratio of intensity of scattering determined by the conventional method of Mie scattering.

Meanwhile the theory of Mie scattering has established that the diameter of particles and the scattering intensity ratio have such a correlation as shown in FIG. 6, providing that the scattering intensity ratio (s/P) is expressed by the quotient of the intensity of the scattered light of the S polarized light divided by the intensity of the scattered light of the p polarized light.

Figure 7:
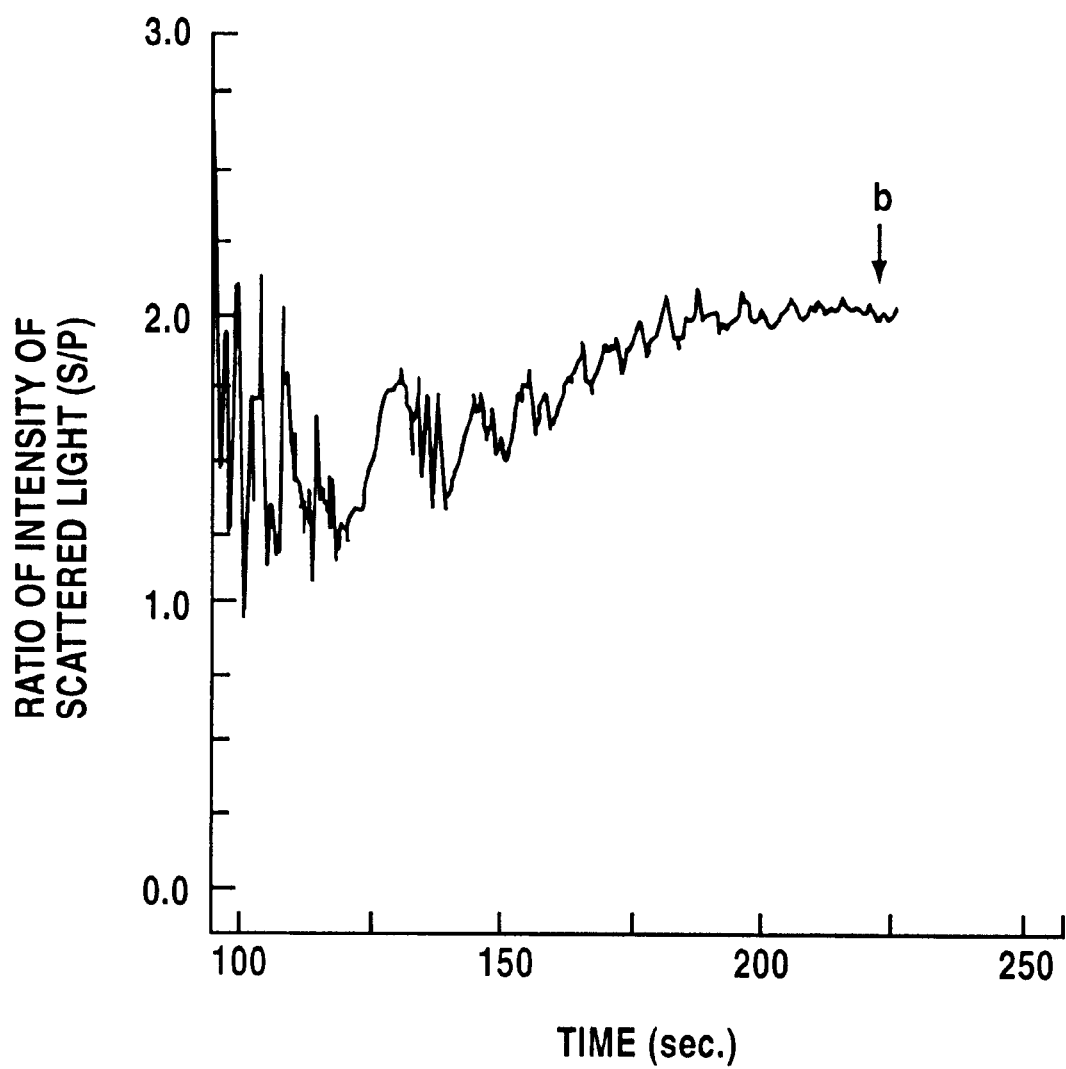
FIG. 7 is a diagram showing the relation between the time and the ratio of intensity of scattered light determined by the conventional method of Mie scattering.

When the scattering intensity ratio was sought based on the S polarization and the P polarization of FIG. 5 representing the results of the measurement by the method of Mie scattering in an effort to investigate the change of the diameter of particles through the process of generation of particles such as are shown in FIGS. 2A–2C, the data shown in FIG. 7 were obtained. The data support an inference that the diameter of particles during the experiment of FIG. 5 can be found based on FIG. 5, FIG. 6, and FIG. 7.

When the data of the scattered light intensity ratio obtained in the duration between 90 seconds and 240 seconds as shown in FIG. 5 was applied to FIG. 7, the diameters of particles which appeared during this time zone were found based on FIG. 6 to fall in the range of 200–300 nm. Since the solid line of FIG. 4 corresponds to the point b of FIG. 5 and also since the scattered light intensity ratio varies nearly continuously from 1.0 to 2.0 in the duration between 100 seconds and 220 seconds as shown in FIG. 5, the size of the particles increased meanwhile from about 200 to about 300 nm. That is to say, the curve of the electron density shifted from a wave line to a solid line in FIG. 4 between in the duration between 100 seconds and 220 seconds.

Incidentally, the point b of FIG. 7 corresponds to the point b of FIG. 5.

FIG. 4 mentioned above compares the presence and the absence of the generation of particles in the chamber 11 and furnishes an explanation concerning the ratio of attenuation of the electron density curve, namely the fall time, in the range of low level of the AM modulated high-frequency electric power shown in FIG. 3.

Then, the present inventors took notice of the difference in the rise time of the electron density curve in the range of high level of the AM modulated high-frequency power and investigated the difference of the rise time of the electron density curve in the presence and in the absence of the generation of particles in the charter 11.

Figure 8:
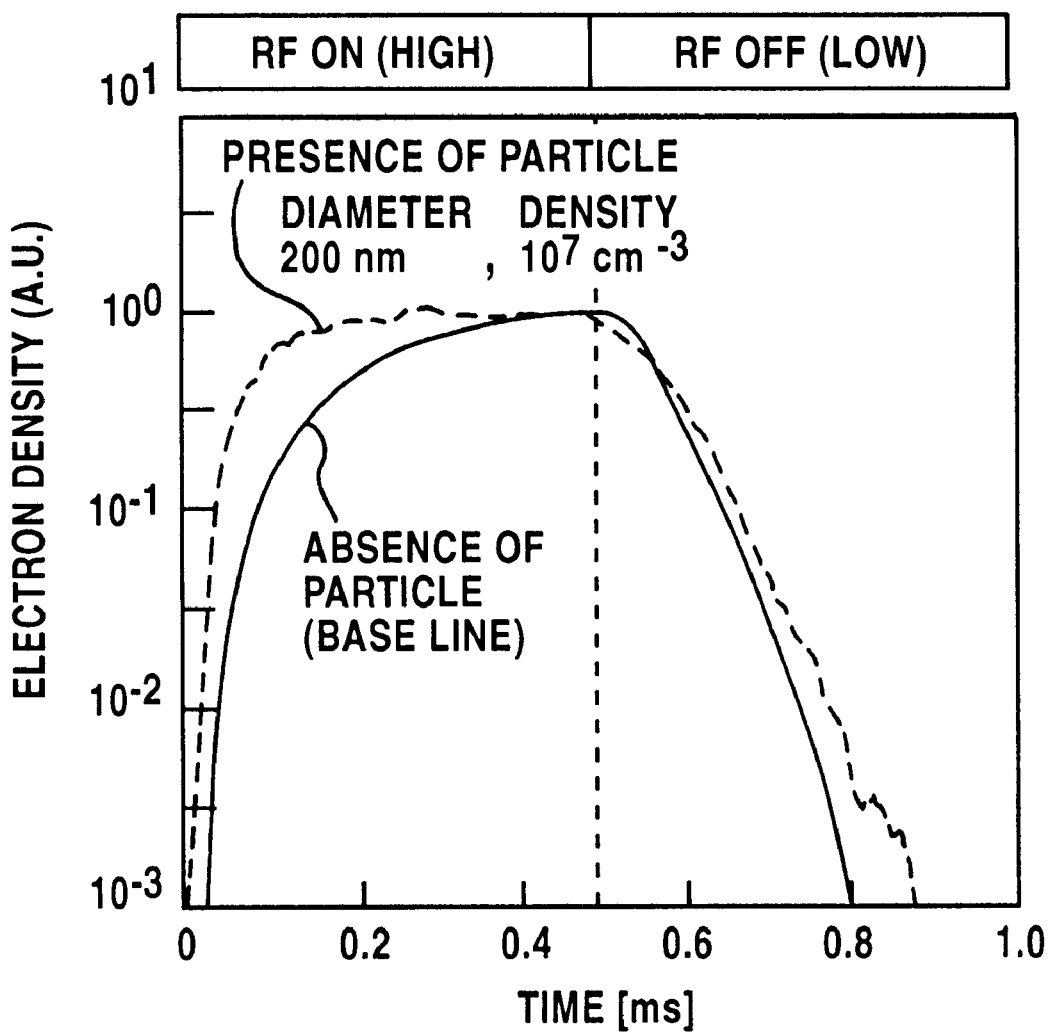
FIG. 8 is a waveform diagram depicting the time-course change of the electron density due to the presence and absence of particles in one embodiment of this invention as standardized by one ON-OFF cycle of high-frequency power.

The numerical values of wave height obtained in the presence and in the absence of particles were equalized by standardizing the respective waveforms of electron density as shown in FIG. 8.

The gas used in the generation of particles for the purpose of obtaining the curves of electron density of FIG. 8 was argon, the pressure of the gas was set at 300 mTorrs, the frequency modulated by the AM modulator 15 was set at 1 kHz, the ON time of the high-frequency power was set at 0.5 milisecond (ms), and the OFF time thereof was set at 0.5 ms. The maximum value of the electron density in the presence of the generation of particles was $1 \times 10^9$ atoms/cm$^3$.

According to FIG. 8, the rise time in the absence of particles was 260 $\mu$s, whereas the rise time in the presence of particles, about 200 nm in diameter, was 200 $\mu$s. That is, the rise time of the electron density curve was shorter when the particles were present than when they were absent.

The reason for this shorter rise time was that the rate of decrease of electrons was lowered because the bipolar diffusion process was suppressed. The rise time of the electron density is decided by the rate of generation of electrons and the rate of loss of electrons and the rise time of electrons is reduced as the rate of loss of electrons is lowered.

A review of the fall time of the standardized curve of electron density reveals that the fall time in the presence of particles is 275 microsecond ($\mu$s) and that in the absence of particles is 125 $\mu$s, namely that the difference of the fall time is similar in the data of FIG. 4.

Here, the long rise time means that the rate of increase of electron density is small and the short rise time means that the rate of increase of electron density is large. Then, the long fall time means that the rate of decrease of electron density is small and the short fall time means that the rate of decrease of electron density is large.

The description, as given above, has covered the change of electron density for one ON-OFF cycle of the AM modulated high-frequency electric power. It should be noted that the AM modulation is not limited to that which is illustrated in FIG. 3.

Figure 9A:
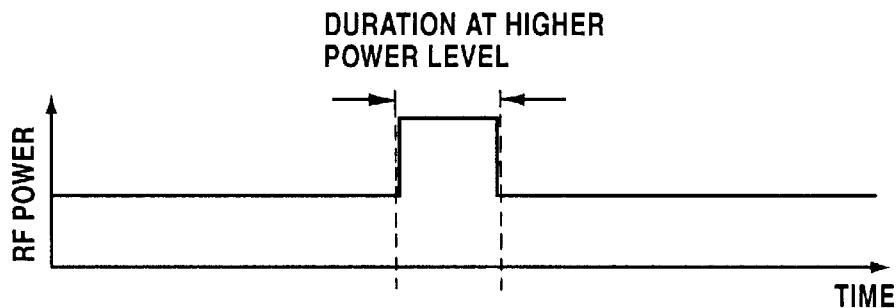
FIG. 9A is a waveform diagram depicting an increase of the magnitude of electron density during the detection of particles in one embodiment of this invention and FIG. 9B is a waveform diagram depicting the change of electron density in conformity to the change of high-frequency power illustrated in FIG. 9A.
Figure 9B:
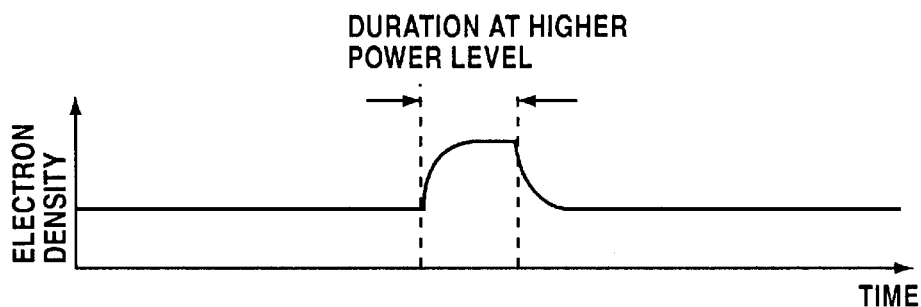

The presence or absence of particles and the size of particles may be determined, for example, by temporarily heightening the power from the high-frequency generator as shown in FIG. 9A thereby obtaining the waveform of electron density in the area A for the generation of particles as shown in FIG. 9B, and studying the waveform and finding the rise or fall time.

Figure 10A:
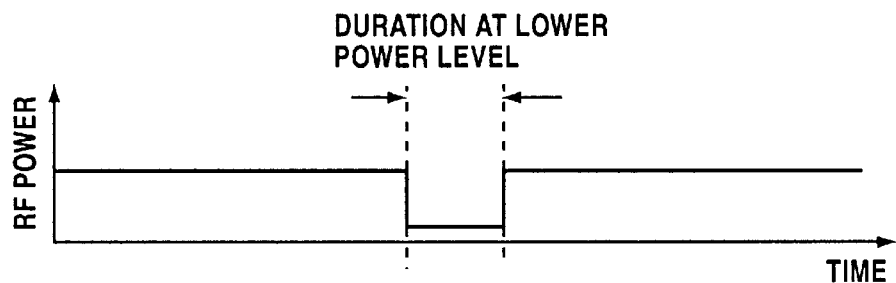
FIG. 10A is a waveform diagram depicting a decrease of the magnitude of electron density during the detection of particles in one embodiment of this invention and FIG. 10B is a waveform diagram depicting the change of electron density in conformity to the change of high-frequency power illustrated in FIG. 10A.
Figure 10B:
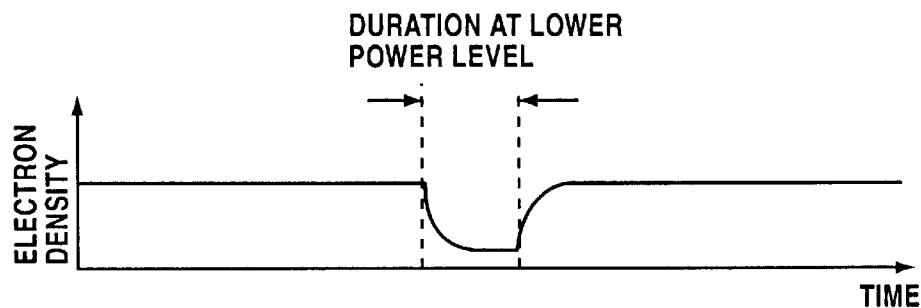

Otherwise, the presence or absence of particles and the size of particles may be determined by temporarily lowering the power from the high-frequency generator as shown in FIG. 10A thereby obtaining the waveform of electron density in the area A for the generation of particles as shown in FIG. 10B, and studying the waveform and finding the fall or rise time.

Figure 11A:
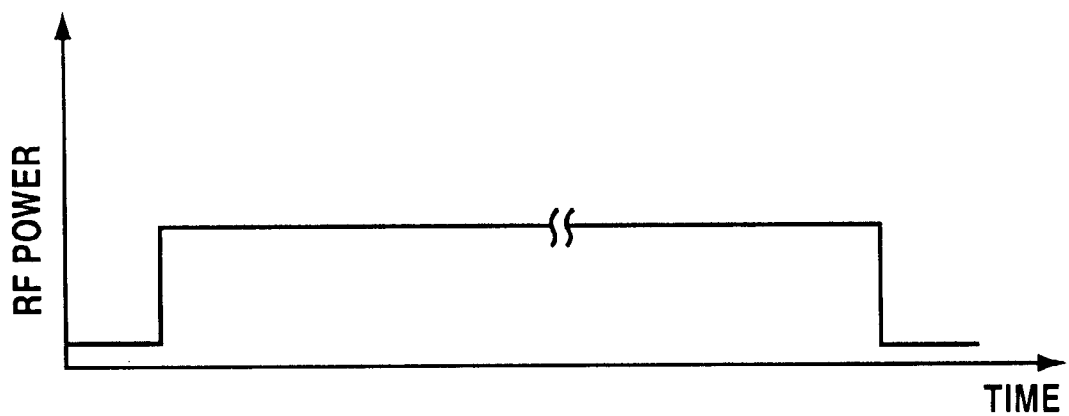
FIG. 11A is a waveform diagram depicting the ON-OFF status of the high-frequency power for the generation of plasma in one embodiment of this invention and FIG. 11B is a waveform diagram depicting the change of electron density in conformity to the change of high-frequency power of FIG. 11A.
Figure 11B:
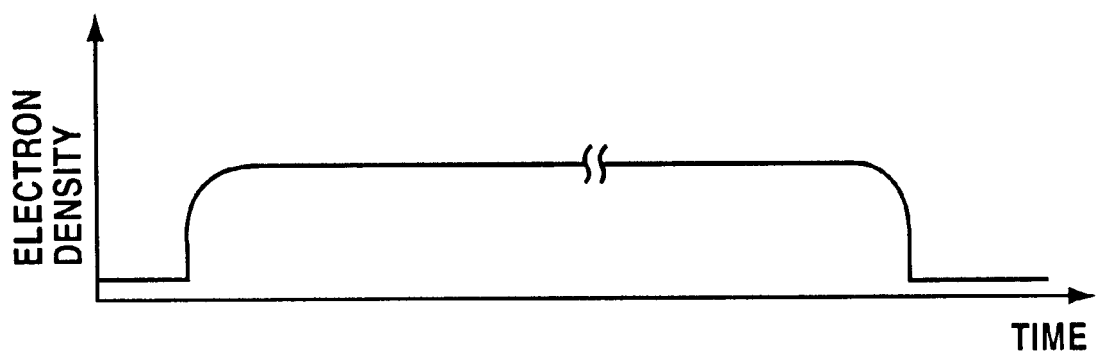

Alternatively, the presence or absence of particles and the size of particles may be determined by obtaining the waveform of electron density in the area A for the generation of particles as shown on the left side of FIG. 11B when the application of the high-frequency power is started as shown on the left side of FIG. 11A and then studying this waveform and finding the rise time. The presence or absence of particles and the size of particles may be determined by obtaining the waveform of electron density in the area A for the generation of particles as shown on the right side of FIG. 11B when the application of high-frequency power is stopped as shown on the right side of FIG. 11A and then studying this waveform and finding the fall time, Incidentally, the time for maintaining the high level of FIG. 9A and the time for maintaining the low level of FIG. 10A are each preferred to be at least one us, though they vary with the size of the apparatus for plasma treatment and the magnitude of the high-frequency electric power. The reason for this particular lower limit is that the detection of the difference of electron density becomes difficult when the time is smaller than 1 $\mu$s. The upper limit of these times may be several milliseconds (ms).

The embodiment described above has covered the construction of the apparatus for generation of plasma. As another example, a plasma etching apparatus or a plasma CVD apparatus may be provided in the chamber thereof with such antennas and microwave interference type circuits as illustrated in FIG. 1 and then operated to measure the number of particles generated in the chamber.

Figure 12:
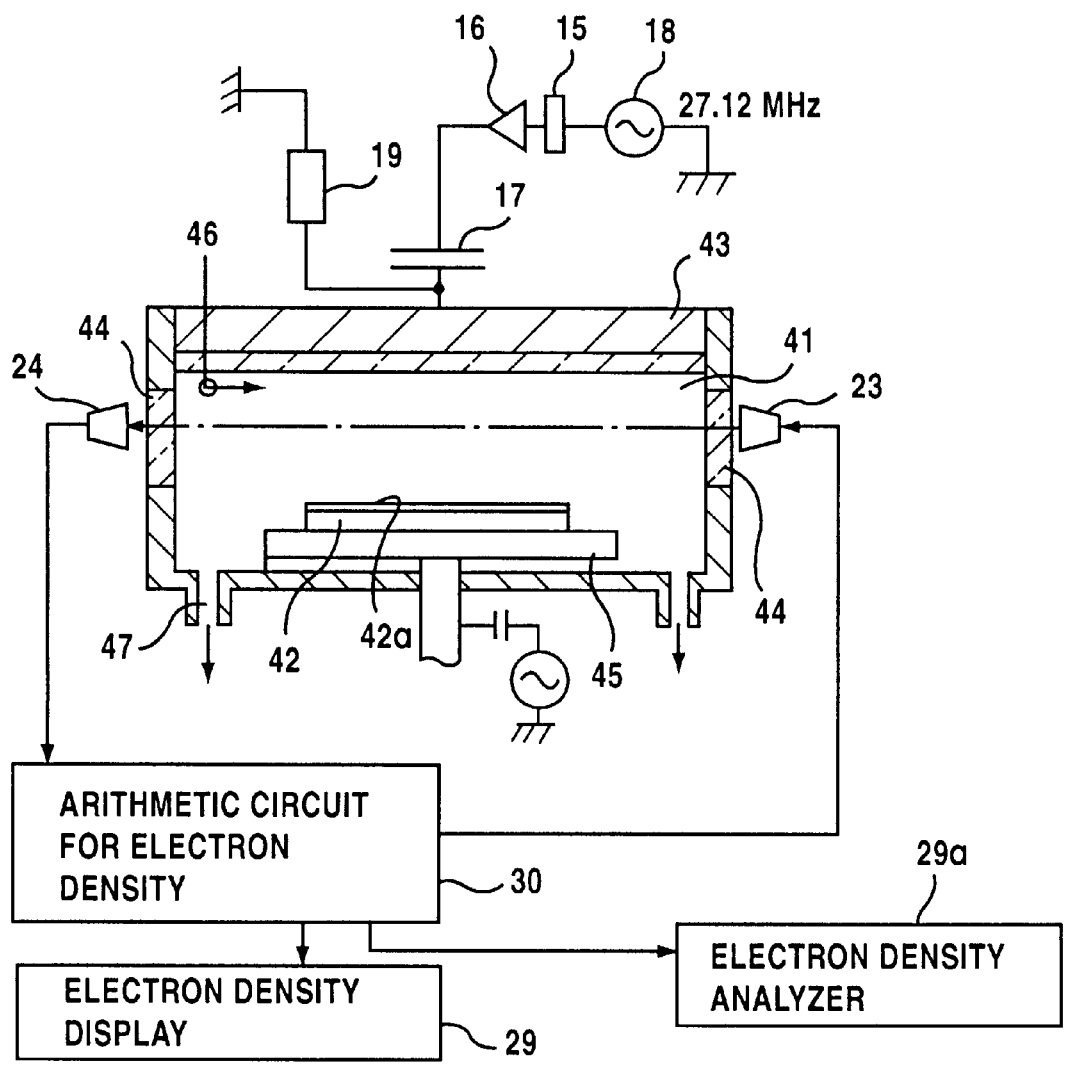
FIG. 12 is a diagram illustrating one example of the plasma etching apparatus provided with a mechanism for the detection of particles according to this invention.

When the plasma etching apparatus to be used happens to be that of the IEM type, for example, as shown in FIG. 12, it adopts a construction such that the high-frequency generator 18, AK modulator 15, and voltage probe 19 are fitted to an upper electrode 43 opposed to a semiconductor wafer 42 inside a chamber 41, the pair of antennas 23 and 24 are disposed outside windows 44 made of silica and disposed on the opposite sides of the chamber 41, an electron density computing circuit 30 illustrated in FIG. 1 is connected to the pair of antennas 23 and 24, and the electron density display device 29 is connected to the electron density computing circuit 30, owing to this construction, the apparatus is enabled to effect measurement of particles and meanwhile etch a membrane 42a on the semiconductor wafer 42. Where the practice of suspending the supply of the high-frequency power for the purpose of measuring the electron density during the process of etching does not prove to be preferable, it is allowable to judge the presence of particles or decide the size and amount of the particles by temporarily varying the magnitude of the power supplied from the high-frequency generator 18 as shown in FIG. 9A, FIG. 10A, and FIG. 11A thereby obtaining such a waveform as shown in FIG. 4 or FIG. 8.

Figure 13:
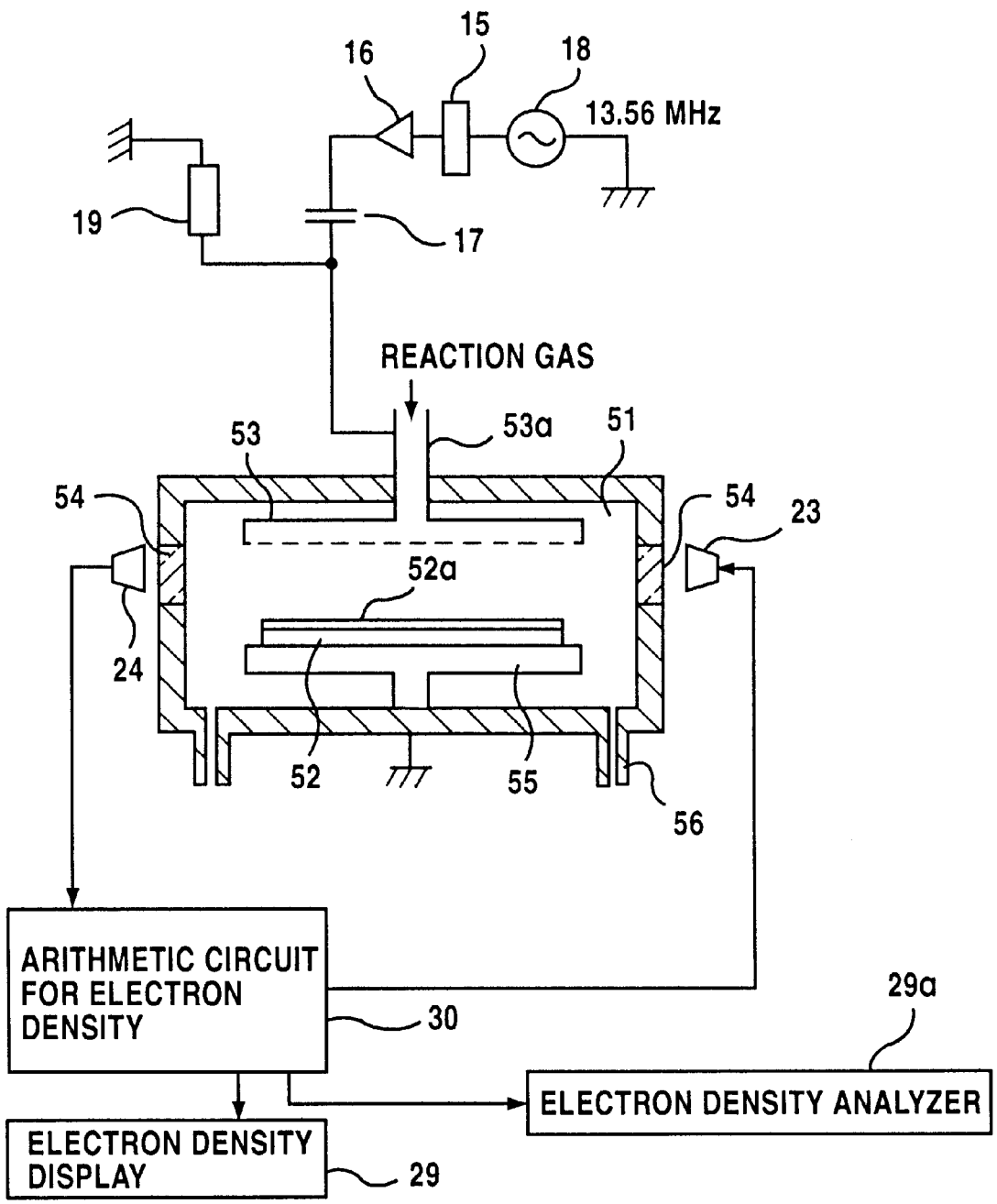
FIG. 13 is a diagram illustrating one example of the plasma CVD apparatus provided with the mechanism for the detection of particles according to this invention.

The reference numeral 45 in FIG. 12 represents a lower electrode which fulfills the function of a mounting base for the semiconductor wafer 42. A high-frequency bias power of several herzes is supplied to the lower electrode 45. The reference numeral 46 represents a gas inlet and the reference numeral 47 a gas outlet, Then, for example, as shown in FIG. 13, the plasma CVD apparatus adopts a construction such that the high-frequency generator 18 is connected via the amplifier 16 and the AM modulator 15 to a combination gas shower and upper electrode 53 opposed to a semiconductor wafer 52 inside a chamber 51, the voltage probe 19 is fitted to the combination gas shower and upper electrode 53, the pair of antennas 23 and 24 are disposed outside windows 54 made of silica and disposed on the lateral wall of the chamber 51, the electron density computing circuit 30 illustrated din FIG. 1 is connected to the pair of antennas 23 and 24, and the electron density display device 29 is connected to the electron density computing circuit 30.

owing to this construction, the plasma CVD apparatus is enabled to effect growth of a membrane 52a formed of insulator, conductor, or semiconductor on the semiconductor wafer 52 and meanwhile detect the presence or absence of particles, and detect the amount of particles. The reference numeral 55 in FIG. 13 represents a lower electrode which fulfills the function of a mounting base for the semiconductor wafer 52, 53a a gas inlet, and 57 a gas outlet.

Besides the construction which attains generation of plasma by supplying the high-frequency power to one electrode, the apparatus for plasma treatment may come in a construction which accomplishes generation of plasma by having the area for plasma generation encompassed with a conductive coil or antenna and supplying the high-frequency power to the conductive coil or antenna and a construction which effects generation of plasma by introducing a microwave from an external source to the area for plasma generation. The apparatuses for plasma treatment which use such constructions may be furnished with the device for measuring particles according to the present embodiment.

As respects the amounts of particles in the chambers 11, 41, and 51, the presence or absence of particles or the amount thereof is decided based on the determination of electron density as already stated. The result of this detection of particles is used as data capable of indicating a due time for cleaning the chambers (maintenance cycle).

Figure 14:
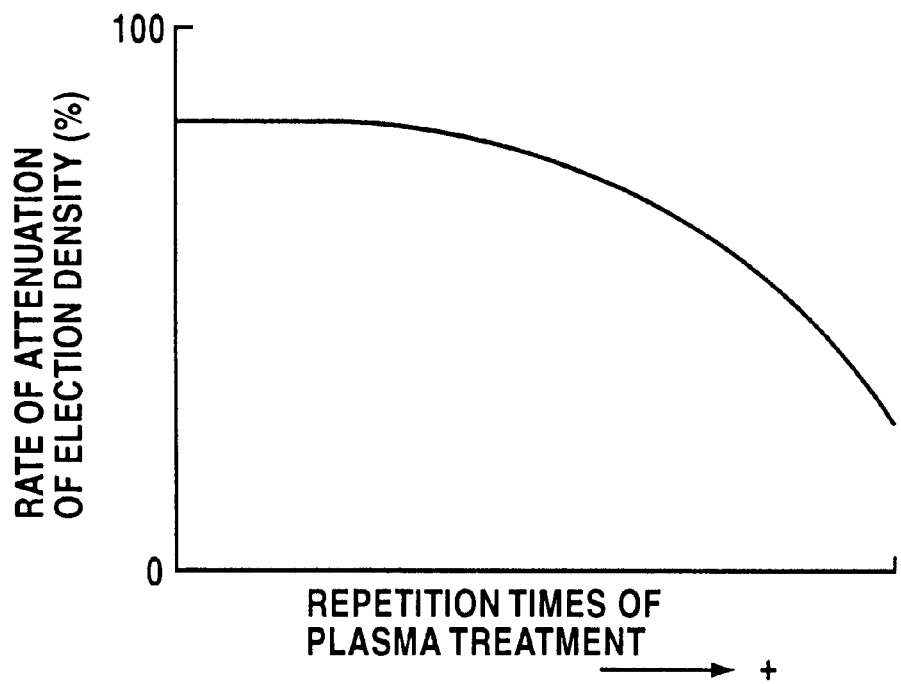
FIG. 14 is a diagram depicting the change in the ratio of attenuation of the electron density relative to the number of repetitions of plasma treatment.

The rate of decrease of electron density indicated by a solid line in FIG. 4, for example, is varied by the amount of particles. In the etching apparatus or the film forming apparatus, for example, the degree of contamination of the interior of a chamber is varied as shown in FIG. 14 by an addition to the number of semiconductor wafers to be treated. In the chambers 11, 41, and 51, the rate of decrease of electron density indicated by the solid line in FIG. 4 decreases in accordance as the number of semiconductor wafers to be treated increases, namely the number of repetitions of the plasma treatment increases. In FIG. 14, the vertical axis constitutes itself the scale of the ratio of attenuation of the rate of decrease of electron density and the horizontal axis the scale of the number of repetitions of the plasma treatment.

Figure 15:
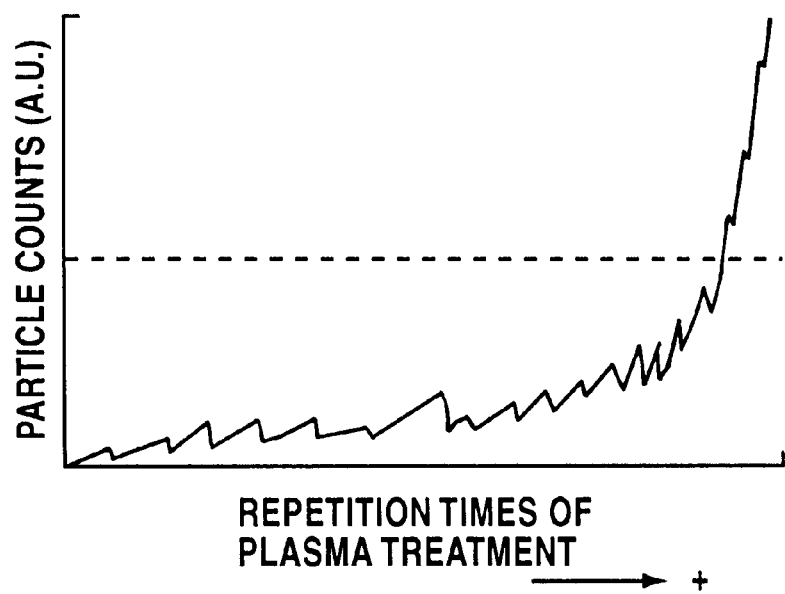
FIG. 15 is a diagram depicting the number of particles deposited on a wafer relative to the number of repetitions of plasma treatment.

FIG. 15 depicts the relation between the number of particles on the semiconductor wafer which has undergone the plasma treatment and the number of repetitions of the plasma treatment. This diagram indicates that the number of particles tends to increase sharply when the number of repetitions surpasses a certain total. According to FIG. 14 and FIG. 15, therefore, the increase of the number of particles deposited on the semiconductor wafer appears later than the change of the rate of attenuation of electron density and then tends to accelerate suddenly.

On the assumption that the broken line of FIG. 15 represents the tolerable level of contamination of wafers with particles, it is noted that the change of the ratio of attenuation of electron density precedes the frequency with which the plasma surpasses the tolerable level of contamination with particles. The reason for this precedence of the change is that the method of plasma treatment described above has an ability to detect far smaller particle diameters than the device for testing wafer surfaces.

By monitoring the time-course change of the rate of attenuation of electron density, therefore, it is made possible to adopt a measure to clean the chambers before the semiconductor wafers begin to succumb to the contamination with particles and, moreover, to effect exact discernment of the approach of contamination of the chambers 11, 41, and 51.

This approach is detected by a chamber contamination display device (device for judging the amount of particles) 29b. To be specific, after each plasma treatment, the data of the peak value p of the waveform of electron density indicated by the solid line in FIG. 4 is emitted from the electron density analyzer 29a to the chamber contamination display device 29b, the time-course rate of attenuation of this peak value p is computed in the chamber contamination display device 29b, and the advance of chamber contamination to a certain stage is judged when the rate of attenuation has reached a prescribed magnitude.

As a means to clean the chambers, a method which consists in removing the chambers 11, 41, and 51 from the film forming apparatus or etching apparatus or a method which consists in passing a current of cleaning gas through the interiors of the chambers 11, 41, and 51 with the chambers 11, 41, and 51 attached to the film forming apparatus or etching apparatus.

The method and apparatus for detecting particles by the change of electron density do not need to be limited to the construction described above.

Figure 16:
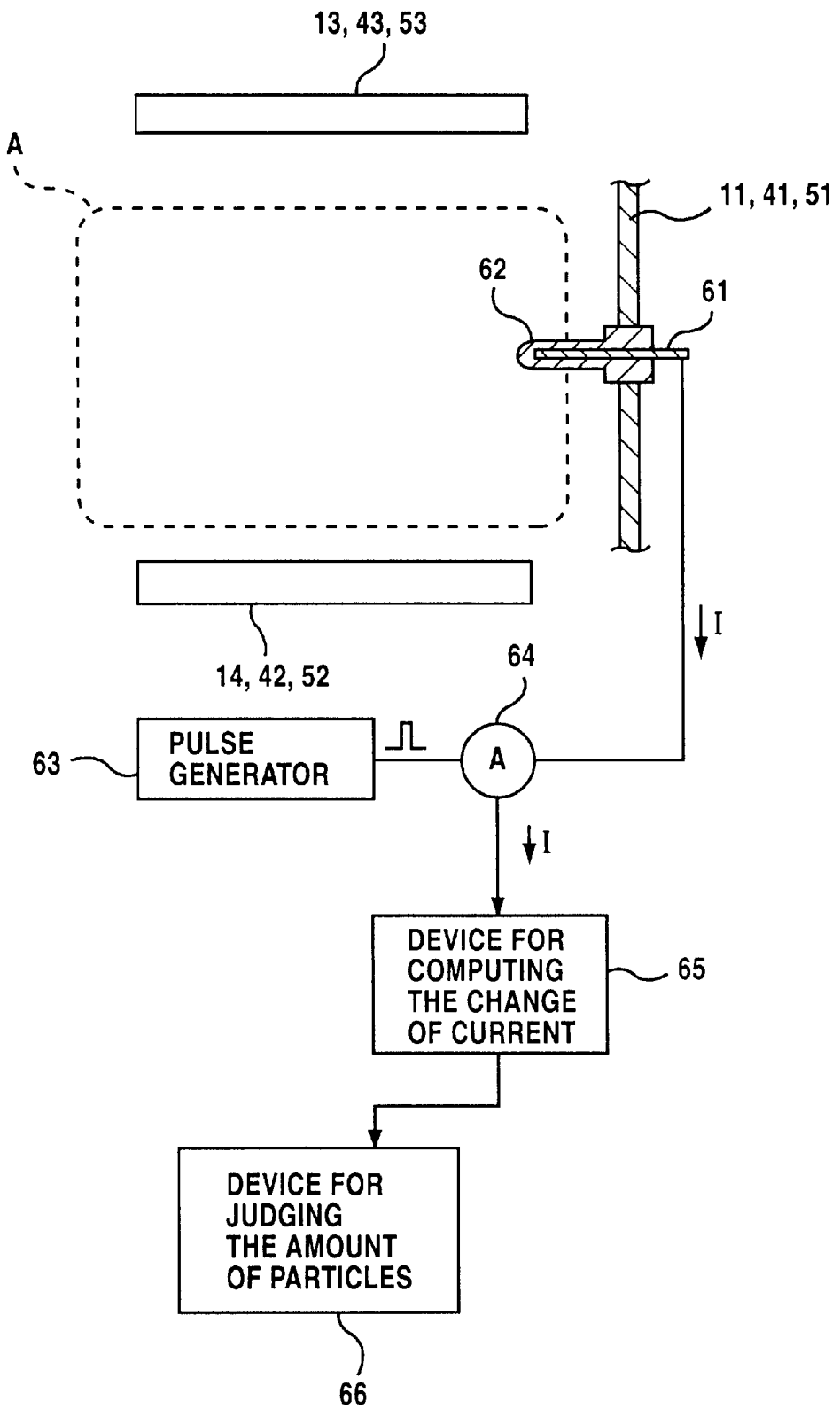
FIG. 16 is a diagram illustrating the essential part of a mechanism for investigating the change of electron density by the use of microelectrodes in the apparatus for plasma treatment of this invention.

The construction in which a needlelike microelectrode 61 covered with an insulating membrane 62 is fitted to the lateral wall of the chamber 11, 41, or 51 and the leading end of the microelectrode 61 is positioned inside the plasma generating area A or in the proximity thereof as illustrated in FIG. 16 is adopted, for example. The needlelike microelectrode 61 is formed of aluminum and the insulating membrane 62 covering the microelectrode is formed of alumina, for example. The diameter of the needlelike microelectrode 61 is set at some hundred $\mu$m, for example.

To this microelectrode 61 is connected a pulse generator 63. The electric current flowing to the pulse generator 63 and the microelectrode 61 is measured by an ammeter 64 and the ratio of change per unit time of the electric current flowing to the ammeter 64 is found by a device 64 for computing the ratio of change of current. In consequence of the computation by the device 65 for computing the change of current, a device 66 for rating the amount of particles decides the presence or absence of particles and the amount of particles based on the time of change of current.

Figure 17:
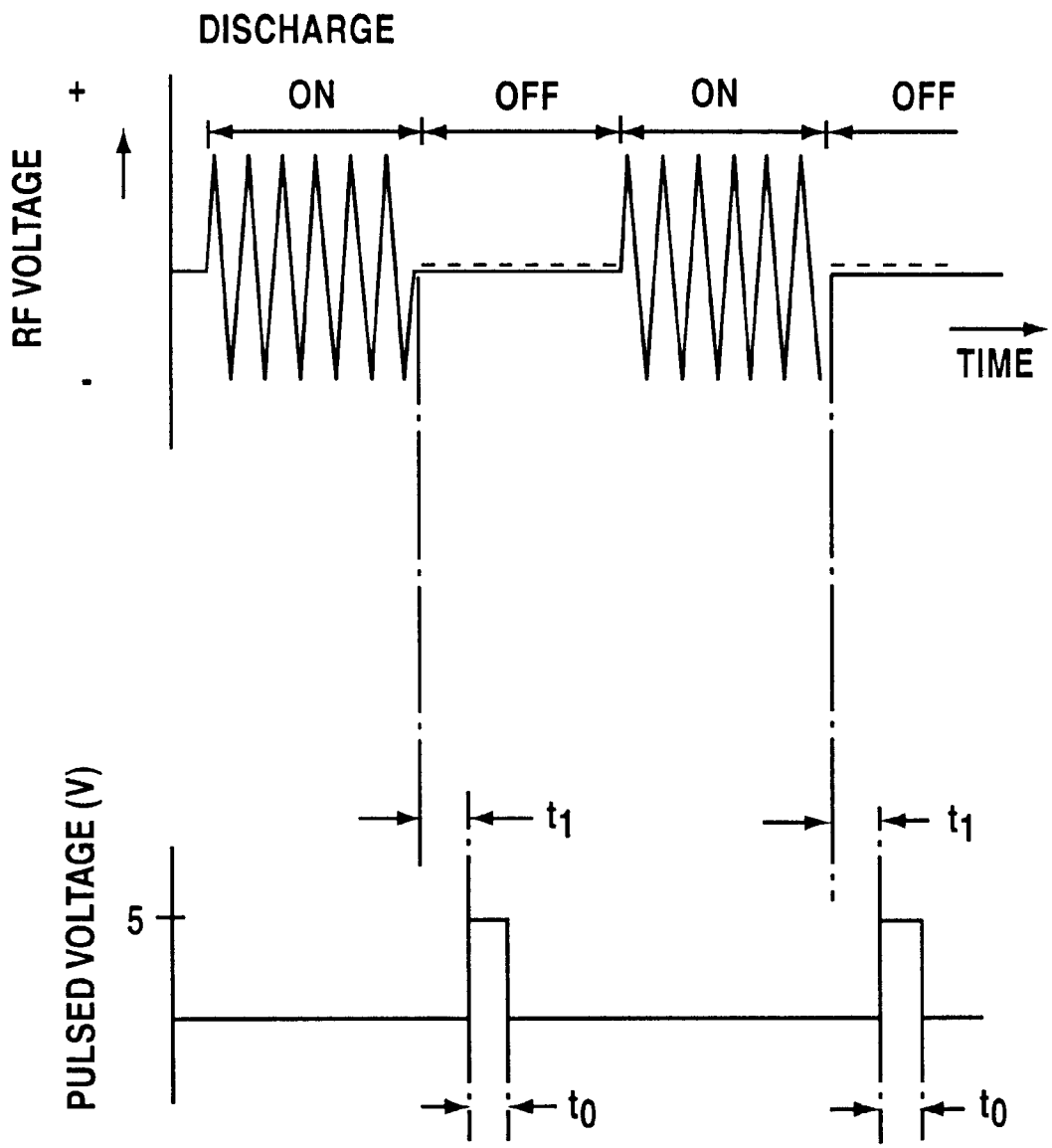
FIG. 17 is a waveform diagram depicting the relation between the waveform of the pulse voltage applied to the microelectrode shown in FIG. 16 and the waveform of the modulated high-frequency power for plasma generation.
Figure 18:
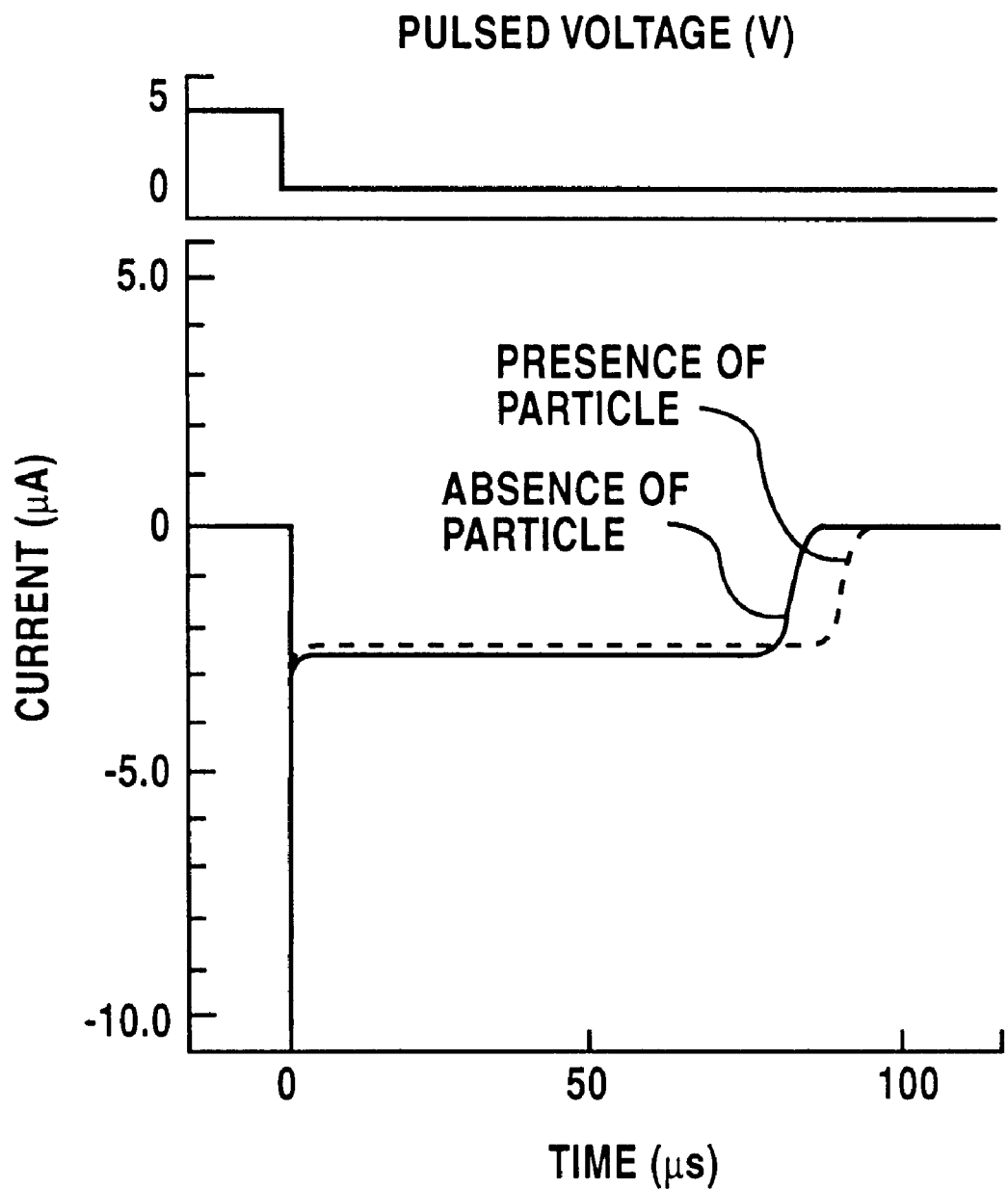
FIG. 18 is a waveform diagram depicting the changes occurring in the waveform of the pulse voltage applied to the microelectrode shown in FIG. 16 and in the electric current flowing to the microelectrode.

The pulse emitted from the pulse generator 63 is applied to the microelectrode 61 after the elapse of a time $t_1$, typically 150 $\mu$s, from the time at which the AM modulated high-frequency power applied between the pair of electrodes 13, 43, 54, 14, 42, or 52 in the chamber 11, 41, or 51 has decreased to zero as shown in FIG. 17. When one rectangular voltage pulse was applied to the microelectrode 61 as shown in FIG. 18, for example, the response of current was varied by the presence or absence of particles.

That is, when the rectangular pulse is applied to the microelectrode, first a displacement current flows briefly to the microelectrode 61 and then a conducting current flows during the fall time. The fall time of the current is elongated by the presence of particles. What is more, the presence of particles results in decreasing the current density and elongating the duration of attenuation of current.

The wave height of the rectangular voltage pulse shown in FIG. 17 is 5 V and the time interval $t_o$ is 100 $\mu$s.

Since this invention contemplates detecting the size and amount of particles in a plasma by the magnitude, ratio of increase, or rate of attenuation of the electron density in the area of plasma as described above, it allows real-time detection of the number of particles with high sensitivity as well as irradiation of a microwave from an external source.

What is claimed is:

1. A method for plasma treatment, comprising the steps of:
   generating a plasma any of (i) on and (ii) above a wafer in a chamber, measuring the electron density of said plasma; and
   detecting the presence of particles suspended in said plasma in said chamber based on any of (i) the magnitude and (ii) the change of said electron density in said plasma.

2. A method for plasma treatment according to claim 1, wherein the presence of particles is judged when said electron density in said plasma is smaller than the standard value.

3. A method for plasma treatment according to claim 1, wherein any of(i) an AM modulated and (ii) a pulse modulated high-frequency electric power is applied to said plasma generation and an increase in any of (i) the number and (ii) the size of said particles is judged when the rate of attenuation of said electron density during a decline of said high-frequency power is smaller than a standard value.

4. A method for plasma treatment according to claim 1, wherein any of(i) an AM modulated and (ii) a pulse modulated high-frequency electric power is applied to said plasma generation and an increase in any of (i) the number and (ii) the size of said particles is judged when the rate of increase of said electron density during an increase of said high-frequency power is larger than the standard value.

5. A method for plasma treatment according to claim 1, wherein any of(i) an AM modulated and (ii) a pulse modulated high-frequency electric power is applied to said plasma and an increase in any of(i) the number and (ii) the size of said particles is judged when the fall time of said electron density during a decrease of said high-frequency power is longer than standard value.

6. A method for plasma treatment according to claim 1, wherein any of(i) an AM modulated and (ii) a pulse modulated high-frequency electric power is applied to said plasma generation and an increase in any of (i) the number and (ii) the size of said particles is judged when the rise time of said electron density during an increase of said high-frequency power is shorter than the standard value.

7. A method for plasma treatment according to claim 1, wherein a microwave is irradiated into said plasma and said electron density is determined based on the phase difference between said microwave which has passed through an area of said plasma and the microwave which has not passed therethrough.

8. A method for plasma treatment according to claim 7, wherein said electron density is determined by multiplying the frequency of said microwave prior to the passage through said area of plasma by said phase difference and further multiplying the resultant product by a pertinent constant.

9. A method for plasma treatment according to claim 1, wherein said chamber is cleaned at the time that the detected amount of said particles has surpassed a tolerable level.

10. A method for plasma treatment according to claim 1, wherein said change of electron density manifests itself in the difference in current response which occurs after a voltage pulse is applied to a microelectrode, said microelectrode being covered with an insulating material and disposed in any of (i) said plasma and (ii) the proximity thereof.

11. An method for plasma treatment according to claim 1, which further comprise etching gas apply device for introducing into said area of said plasma.

12. An method for plasma treatment according to claim 1, which further comprise reacting gas apply device for applying reaction gas to form film into said area of said plasma.

13. An apparatus for plasma treatment furnished with a device for retaining a semiconductor wafer subjected to an etching treatment or film forming treatment in a chamber and a high-frequency power for the generation of plasma into said chamber, comprising:
- a microwave irradiating device for irradiating a microwave to an area of said plasma in said chamber;
- a receiving device for receiving said microwave which has passed through said area of said plasma;
- a phase difference detecting device for determining the phase difference between said microwave which has impinged on said receiving device and said microwave irradiated from said microwave irradiating device; and
- an arithmetic device for computing any of (i) a magnitude of electron density in said area of said plasma and (ii) a ratio of change thereof based on said phase difference.

14. An apparatus for plasma treatment according to claim 13, which further comprises an analyzer for determining any of (i) a size and (ii) an amount of particles in accordance with said magnitude or said ratio change of electron density determined by said arithmetic device.

15. An apparatus for plasma treatment according to claim 13, which further comprises a power amount adjusting device for varying said magnitude of said high-frequency power during the detection of said phase difference by said phase difference detecting device.

16. An apparatus for plasma treatment according to claim 15, wherein said power amount adjusting device is any of (i) an AM modulating device and (ii) a pulse modulating device.

17. An apparatus for plasma treatment furnished with a device for retaining a semiconductor wafer subjected to an etching treatment or film forming treatment in a chamber and a high-frequency power for the generation of plasma into said chamber, comprising:
- a microelectrode disposed in any of (i) an area for plasma generation and (ii) the proximity thereof and covered with an insulating membrane;
- a power source for supplying a voltage pulse to said microelectrode;
- current measuring device for measuring the electric current flowing between said power source and said microelectrode; and
- an arithmetic device for computing any of (i) the magnitude of electron density in said area for plasma generation and (ii) the ratio of change thereof based on said current.

* * * * *